United States Patent
Lee et al.

(10) Patent No.: US 10,985,215 B2
(45) Date of Patent: Apr. 20, 2021

(54) IMAGE SENSORS AND ELECTRONIC DEVICES

(71) Applicant: Samsung Electronics Co., Ltd., Suwon-si (KR)

(72) Inventors: Gae Hwang Lee, Seongnam-si (KR); Dong-Seok Leem, Hwaseong-si (KR); Kwang Hee Lee, Hwaseong-si (KR); Sung Young Yun, Suwon-si (KR); Yong Wan Jin, Seoul (KR)

(73) Assignee: Samsung Electronics Co., Ltd., Gyeonggi-do (KR)

(*) Notice: Subject to any disclaimer, the term of this patent is extended or adjusted under 35 U.S.C. 154(b) by 0 days.

(21) Appl. No.: 16/167,655

(22) Filed: Oct. 23, 2018

(65) Prior Publication Data
US 2019/0245008 A1    Aug. 8, 2019

(30) Foreign Application Priority Data
Feb. 5, 2018 (KR) .................. 10-2018-0013884

(51) Int. Cl.
*H01L 27/14* (2006.01)
*H01L 27/30* (2006.01)
(Continued)

(52) U.S. Cl.
CPC .......... *H01L 27/307* (2013.01); *G02B 5/208* (2013.01); *H01L 27/14621* (2013.01);
(Continued)

(58) Field of Classification Search
CPC combination set(s) only.
See application file for complete search history.

(56) References Cited

U.S. PATENT DOCUMENTS 7,154,157 B2    12/2006    Bradski et al.
8,848,047 B2    9/2014    Inuiya et al.
(Continued)

FOREIGN PATENT DOCUMENTS

EP    2879181 A1    6/2015
JP    2009-027063 A    2/2009
(Continued)

OTHER PUBLICATIONS

Extended European Search Report dated Jun. 28, 2019 for corresponding European Application No. 19154843.7.

*Primary Examiner* — Moin M Rahman
(74) *Attorney, Agent, or Firm* — Harness, Dickey & Pierce, P.L.C.

(57) ABSTRACT

An image sensor may include a photodiode within a semiconductor substrate and configured to sense light in an infrared wavelength spectrum of light, a photoelectric conversion device on the semiconductor substrate and configured to sense light in a visible wavelength spectrum of light, and a filtering element configured to selectively transmit at least a portion of the infrared wavelength spectrum of light and the visible wavelength spectrum of light. The filtering element may include a plurality of color filters on the photoelectric conversion device. The photoelectric conversion device may include a pair of electrodes facing each other and a photoelectric conversion layer between the pair of electrodes and configured to selectively absorb light in a visible wavelength spectrum of light. The filtering element may be between the semiconductor substrate and the photoelectric conversion device and may selectively absorb the infrared light and selectively transmit the visible light.

21 Claims, 9 Drawing Sheets

(51) Int. Cl.
*H01L 27/146* (2006.01)
*G02B 5/20* (2006.01)
*H01L 51/44* (2006.01)
*H01L 51/00* (2006.01)

(52) U.S. Cl.
CPC .. *H01L 27/14649* (2013.01); *H01L 27/14667* (2013.01); *H01L 51/44* (2013.01); *H01L 51/0046* (2013.01); *H01L 51/0047* (2013.01)

(56) References Cited

U.S. PATENT DOCUMENTS

| | | | |
|---|---|---|---|
| 9,264,676 B2 | 2/2016 | Cohen et al. | |
| 9,793,324 B2 | 10/2017 | Joei | |
| 2008/0203311 A1* | 8/2008 | Watanabe | G01T 1/2928 250/370.08 |
| 2015/0002719 A1* | 1/2015 | Isono | H01L 27/14683 348/311 |
| 2016/0064456 A1 | 3/2016 | Lee et al. | |
| 2016/0099430 A1 | 4/2016 | Kim et al. | |
| 2016/0336365 A1* | 11/2016 | Huang | H01L 27/14621 |
| 2017/0317132 A1 | 11/2017 | Hatakeyama et al. | |
| 2018/0027171 A1* | 1/2018 | Yoshimura | H04N 5/23212 257/40 |
| 2018/0159059 A1* | 6/2018 | Takemura | H01L 31/10 |
| 2019/0157341 A1* | 5/2019 | Chang | H01L 27/156 |
| 2019/0189696 A1* | 6/2019 | Yamaguchi | H01L 27/146 |
| 2020/0227513 A1* | 7/2020 | Sato | H01L 29/78672 |

FOREIGN PATENT DOCUMENTS

| | | |
|---|---|---|
| JP | 2011166477 A | 8/2011 |
| JP | 5075512 B2 | 11/2012 |
| JP | 6136663 B2 | 5/2017 |
| KR | 20000046221 A | 7/2000 |
| KR | 20130014222 A | 2/2013 |
| KR | 20160039974 A | 4/2016 |
| KR | 10-1666600 | 10/2016 |
| KR | 20170101893 A | 9/2017 |
| WO | WO-2017104486 A1 | 6/2017 |

\* cited by examiner

[FIG. 1]
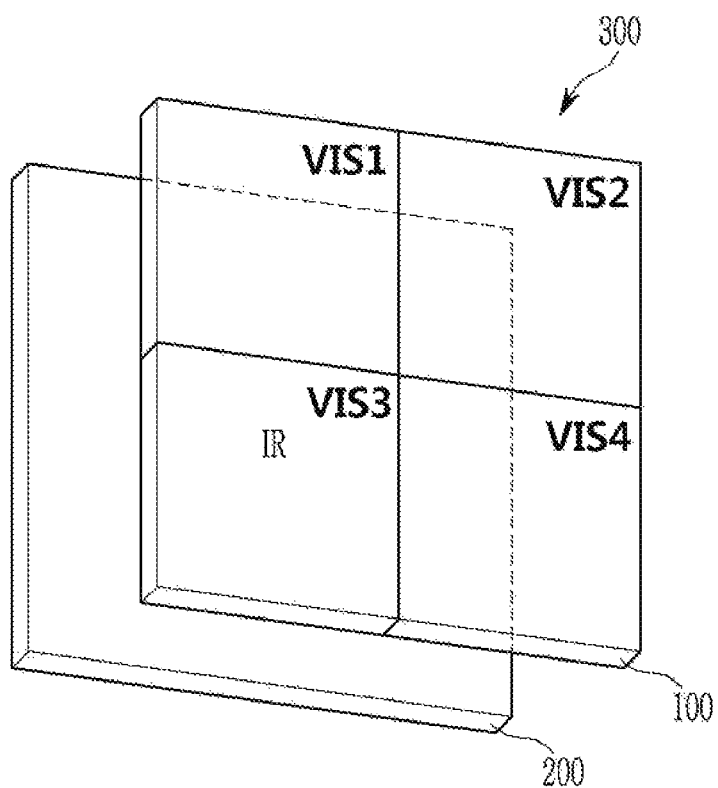

[FIG. 2]
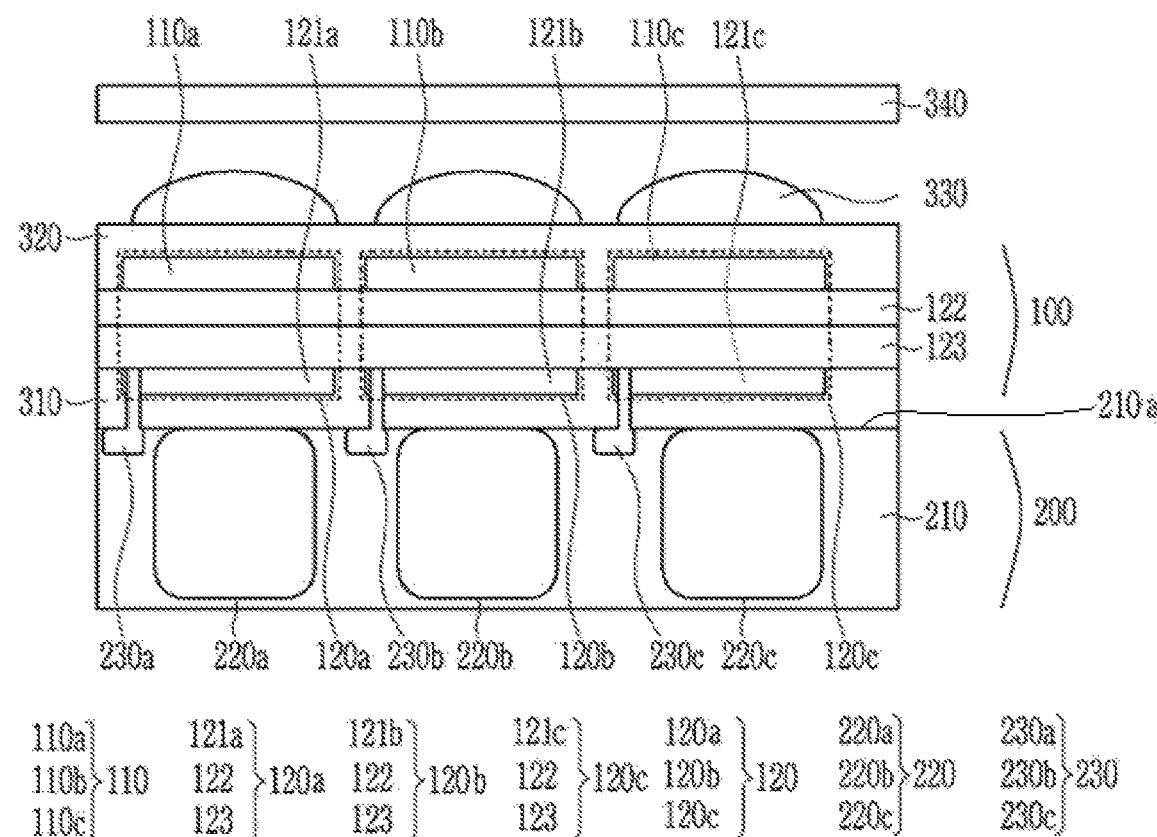

【FIG. 3】
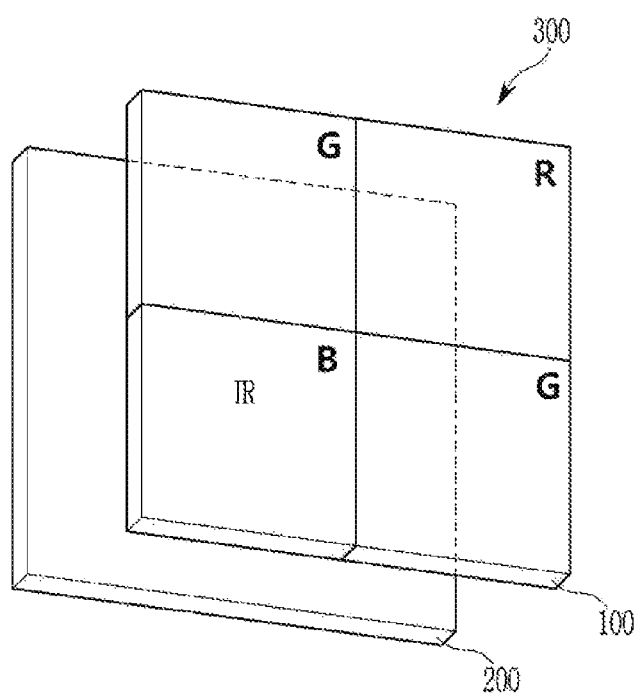

[FIG. 4]
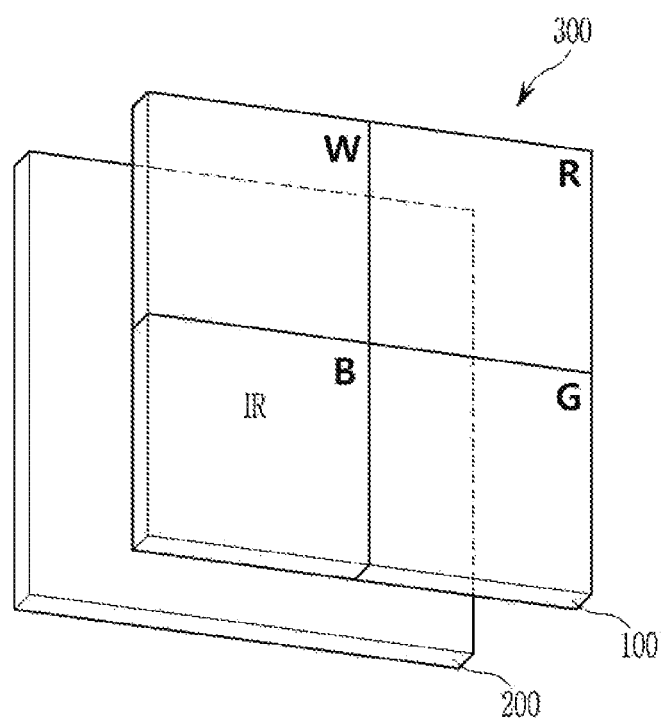

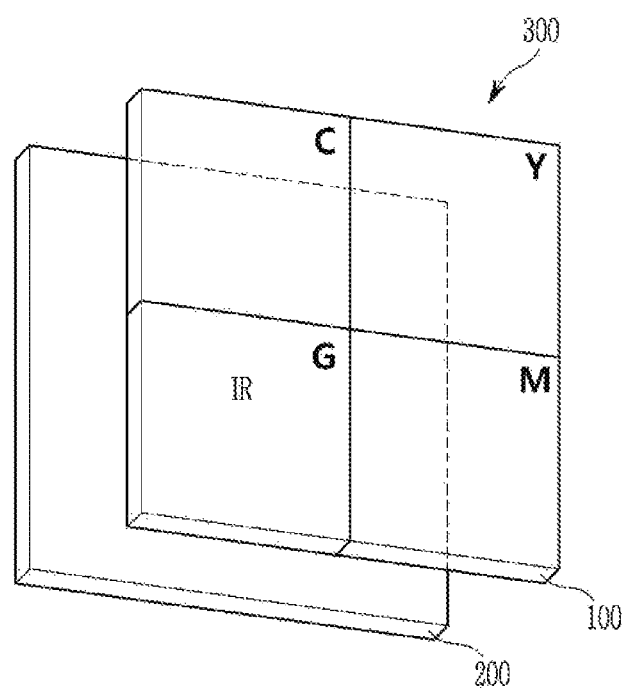
【FIG. 5】

【FIG. 6】
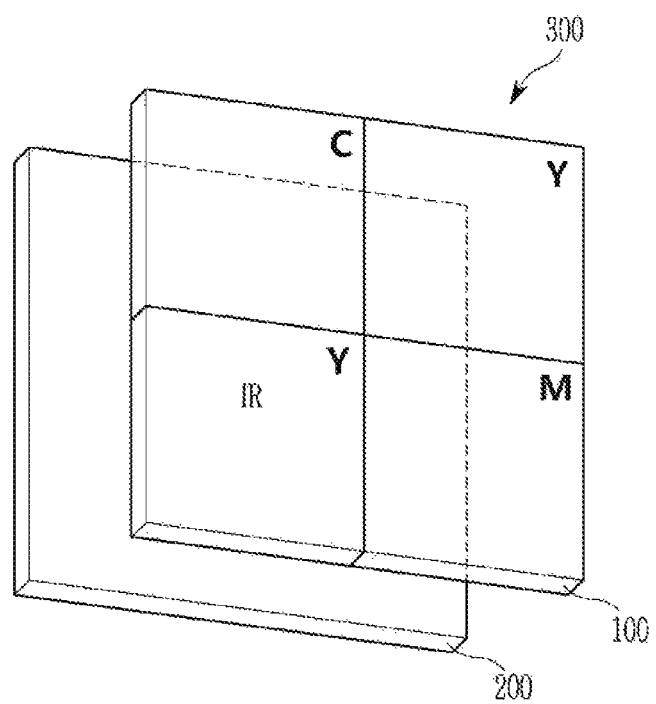

[FIG. 7]
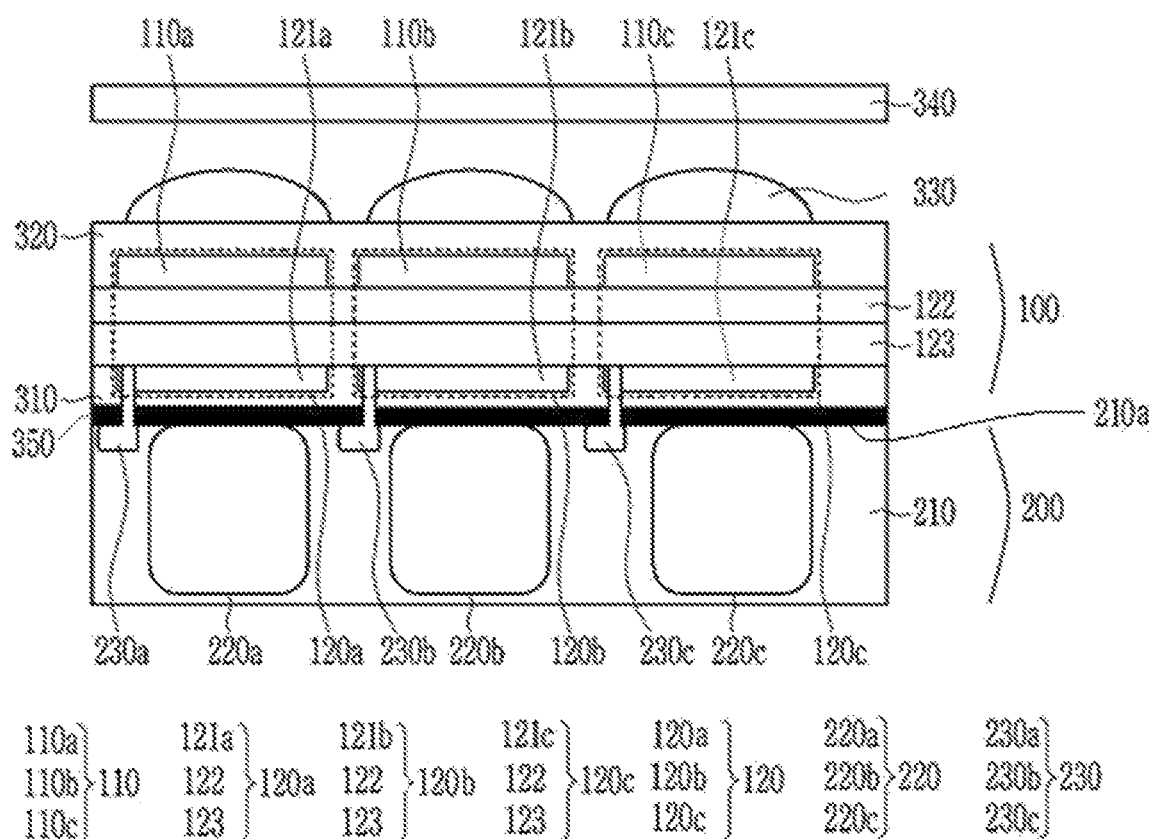

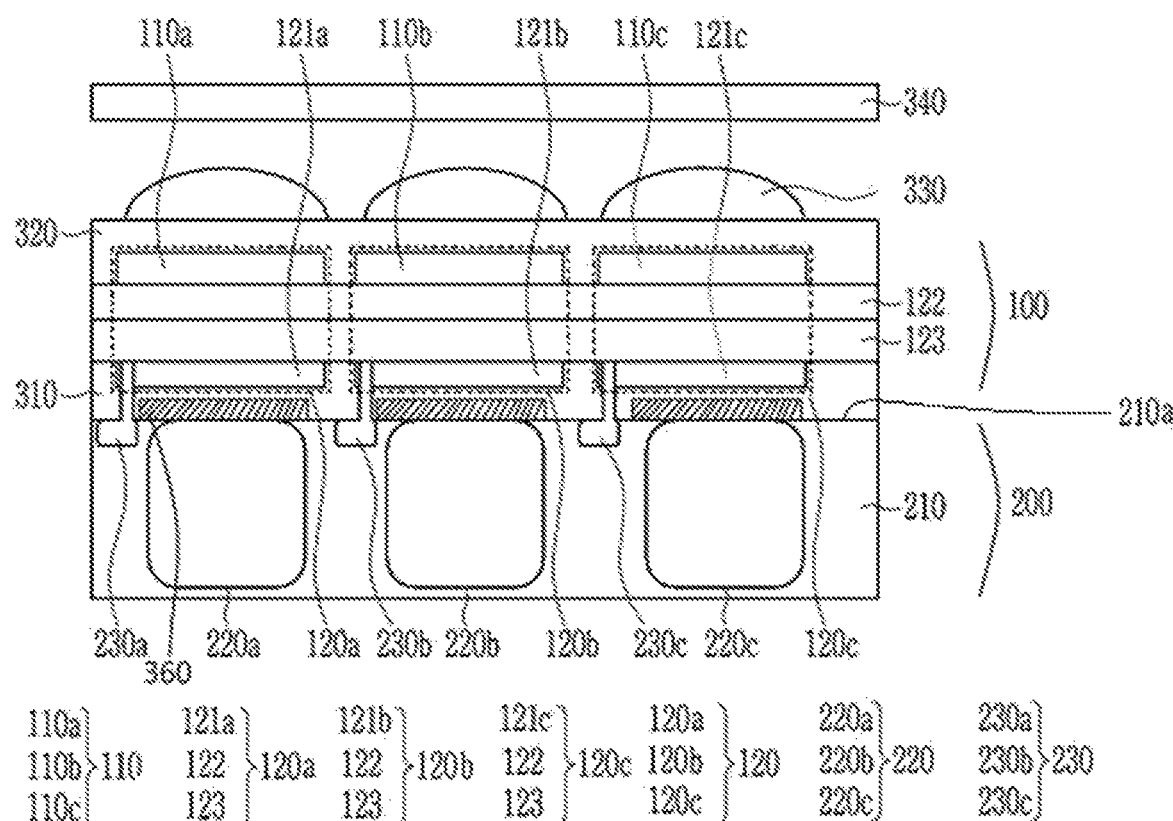
[FIG. 8]

[FIG. 9]
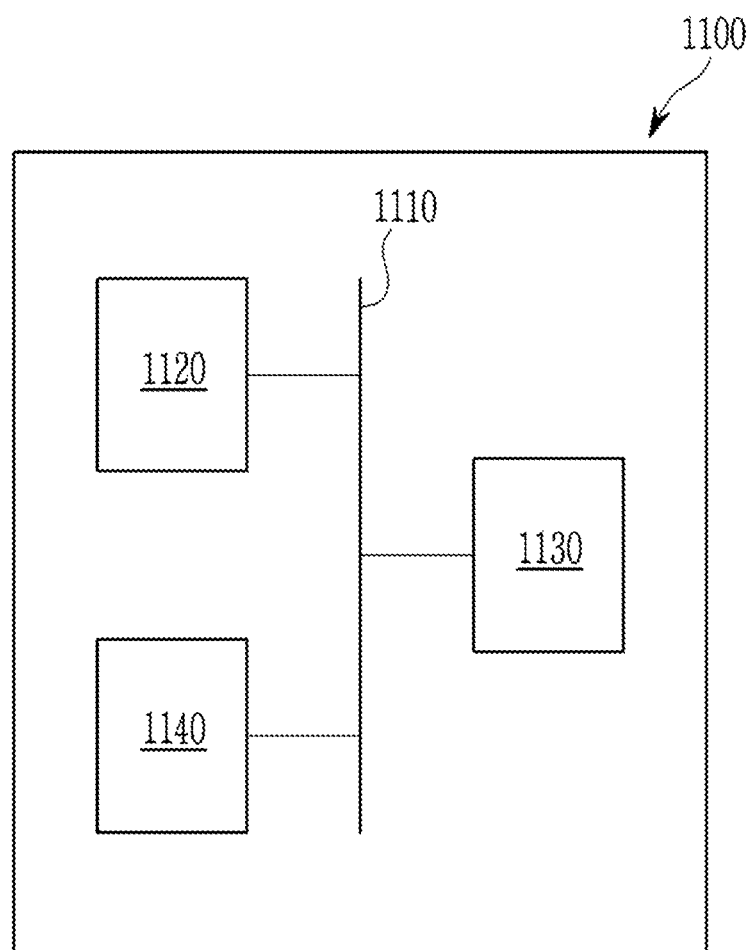

IMAGE SENSORS AND ELECTRONIC DEVICES

CROSS-REFERENCE TO RELATED APPLICATION

This application claims priority to and the benefit of, under 35 U.S.C. § 119, Korean Patent Application No. 10-2018-0013884 filed in the Korean Intellectual Property Office on Feb. 5, 2018, the entire contents of which are incorporated herein by reference.

BACKGROUND

1. Field

Image sensors and electronic devices are disclosed.

2. Description of the Related Art

Cameras, camcorders, and the like may include image sensors configured to take ("capture") one or more images and storing the captured one or more images as one or more electrical signals. Recently, research on using one or more sensors as one or more biometric apparatuses also has been made. Various sensors, including image sensors, may be utilized in combination with performing various complex functions, as well as providing down-sizing and a high resolution, in order to provide various functionalities.

SUMMARY

Some example embodiments provide an image sensor configured to provide improved performance without having increased physical size.

Some example embodiments provide an electronic device including the image sensor.

According to some example embodiments, an image sensor may include a photodiode within a semiconductor substrate, a photoelectric conversion device on the semiconductor substrate, and a plurality of color filters on the photoelectric conversion device, such that the photoelectric conversion device is between the plurality of color filters and the semiconductor substrate. The photodiode may be configured to sense light in an infrared wavelength spectrum of light. The photoelectric conversion device may be configured to sense light in a visible wavelength spectrum of light. The photoelectric conversion device may include a pair of electrodes facing each other, and a photoelectric conversion layer between the pair of electrodes. The photoelectric conversion layer may be configured to selectively absorb light in the visible wavelength spectrum of light.

The photoelectric conversion layer may be configured to absorb light in an entirety of the visible wavelength spectrum of light.

The photoelectric conversion layer may include a p-type semiconductor and an n-type semiconductor, and the n-type semiconductor may include fullerene or a fullerene derivative.

At least one semiconductor of the p-type semiconductor and the n-type semiconductor may include a light absorbing material configured to absorb light in at least a part of the visible wavelength spectrum of light. The p-type semiconductor and the n-type semiconductor may be collectively configured to absorb light in an entirety of the visible wavelength spectrum of light.

Each semiconductor of the p-type semiconductor and the n-type semiconductor is configured to not substantially absorb light in the infrared wavelength spectrum of light.

The photoelectric conversion layer may include an amount of the n-type semiconductor that is equal or greater than an amount of the p-type semiconductor in the photoelectric conversion layer.

The photoelectric conversion layer may be an organic photoelectric conversion layer that includes at least one organic light absorbing material.

Each color filter of the plurality of color filters may be configured to transmit light in at least one wavelength spectrum of light of a red wavelength spectrum of light, a green wavelength spectrum of light, and a blue wavelength spectrum of light, and light in the infrared wavelength spectrum of light.

Each color filter of the plurality of color filters may be selected from a red filter, a blue filter, a green filter, a cyan filter, a magenta filter, a yellow filter, and a white filter.

At least one color filter of the plurality of color filters may have an average light transmittance of greater than or equal to about 70% in an infrared wavelength spectrum of light of about 800 nm to about 1000 nm.

The photodiode may be at least partially within the semiconductor substrate at a depth of about 0 nm to about 7000 nm from a surface of the semiconductor substrate.

The image sensor may further include a visible light blocking film between the semiconductor substrate and the photoelectric conversion device.

The image sensor may further include a transflective layer between the semiconductor substrate and the photoelectric conversion device. The transflective layer may be configured to selectively reflect at least one part of the visible wavelength spectrum of light.

The image sensor may further include a bandpass filter on the plurality of color filters and configured to selectively transmit light in the visible wavelength spectrum of light and light in the infrared wavelength spectrum of light.

According to some example embodiments, an image sensor may include a color filter, an organic photoelectric conversion device, and an inorganic photodiode that are sequentially stacked from a light incidence direction. The organic photoelectric conversion device may be configured to photoelectrically convert light in a visible wavelength spectrum of light that passes the color filter, and the inorganic photodiode may be configured to sense light in an infrared wavelength spectrum of light.

The color filter and the organic photoelectric conversion device may be on a semiconductor substrate, and the inorganic photodiode may be within the semiconductor substrate.

The inorganic photodiode may be at least partially within the semiconductor substrate at a depth of about 0 nm to about 7000 nm from a surface of the semiconductor substrate.

The organic photoelectric conversion device may include a pair of electrodes facing each other, and an organic photoelectric conversion layer between the pair of electrodes and configured to selectively absorb light in the visible wavelength spectrum of light.

The organic photoelectric conversion layer may include an organic light absorbing material, and fullerene or a fullerene derivative.

The organic photoelectric conversion layer may be configured to absorb light in an entirety of the visible wavelength spectrum of light.

The color filter may include at least one filter of a red filter, a blue filter, a green filter, a cyan filter, a magenta filter, a yellow filter, and a white filter.

An electronic device may include the image sensor.

According to some example embodiments, an image sensor may include a photodiode within a semiconductor substrate, a photoelectric conversion device on the semiconductor substrate, and a filtering element. The photodiode may be configured to sense light in a first wavelength spectrum of light. The photoelectric conversion device may be configured to selectively absorb light in a second wavelength spectrum of light. The filtering element may be configured to selectively transmit at least a portion of the first wavelength spectrum of light and the second wavelength spectrum of light.

The filtering element may include a transflective layer between the semiconductor substrate and the photoelectric conversion device. The transflective layer may be configured to selectively reflect at least one part of the second wavelength spectrum of light.

The filtering element may be between the semiconductor substrate and the photoelectric conversion device. The filtering element may be configured to selectively absorb the first wavelength spectrum of light and selectively transmit the second wavelength spectrum of light.

The first wavelength spectrum of light may be an infrared wavelength spectrum of light, the second wavelength spectrum of light may be a visible wavelength spectrum of light, and the filtering element may be a color filter on the photoelectric conversion device, such that the photoelectric conversion device is between the color filter and the semiconductor substrate, the color filter configured to selectively filter at least a portion of the visible wavelength spectrum of light.

The image sensor may further include a plurality of color filters, the plurality of color filters including the color filter, wherein each color filter of the plurality of color filters is configured to transmit light in at least one wavelength spectrum of light of a red wavelength spectrum of light, a green wavelength spectrum of light, and a blue wavelength spectrum of light, and light in an infrared wavelength spectrum of light.

Each color filter of the plurality of color filters may be selected from a red filter, a blue filter, a green filter, a cyan filter, a magenta filter, a yellow filter, and a white filter.

At least one color filter of the plurality of color filters may have an average light transmittance of greater than or equal to about 70% in an infrared wavelength spectrum of light of about 800 nm to about 1000 nm.

The image sensor may further include a bandpass filter on the color filter and configured to selectively transmit light in the visible wavelength spectrum of light and light in the infrared wavelength spectrum of light.

The image sensor may further include an additional photodiode within the semiconductor substrate, the additional photodiode between the photodiode and the photoelectric conversion device such that the photodiode and the additional photodiode overlap in a direction extending substantially orthogonally to the photoelectric conversion device, the additional photodiode configured to sense light in a separate visible wavelength spectrum of light that is different from the visible wavelength spectrum of light that the photoelectric conversion device is configured to selectively absorb.

The photoelectric conversion device may include a photoelectric conversion layer configured to selectively absorb light in the visible wavelength spectrum of light, and the photoelectric conversion layer may be configured to absorb light in an entirety of the second wavelength spectrum of light.

The first wavelength spectrum of light may be an infrared wavelength spectrum of light, the second wavelength spectrum of light may be a visible wavelength spectrum of light, the photoelectric conversion layer may include a p-type semiconductor and an n-type semiconductor, and the n-type semiconductor may include fullerene or a fullerene derivative.

The p-type semiconductor may include at least one light absorbing material configured to absorb light in at least a part of the visible wavelength spectrum of light, and the p-type semiconductor and the n-type semiconductor may be collectively configured to absorb light in an entirety of the visible wavelength spectrum of light.

Each semiconductor of the p-type semiconductor and the n-type semiconductor may be configured to not substantially absorb light in the infrared wavelength spectrum of light.

The photoelectric conversion layer may include an amount of the n-type semiconductor that is equal or greater than an amount the p-type semiconductor in the photoelectric conversion layer.

The photoelectric conversion layer may be an organic photoelectric conversion layer that includes at least one organic material.

The photodiode may be at least partially within the semiconductor substrate at a depth of about 0 nm to about 7000 nm from a surface of the semiconductor substrate.

The first wavelength spectrum of light may be an infrared wavelength spectrum of light, the second wavelength spectrum of light may be a visible wavelength spectrum of light, and the filtering element may be a visible light blocking film between the semiconductor substrate and the photoelectric conversion device.

BRIEF DESCRIPTION OF THE DRAWINGS

FIG. 1 is a schematic top plan view showing a unit pixel of an image sensor according to some example embodiments, FIG. 2 is a cross-sectional view showing the image sensor of FIG. 1 according to some example embodiments, FIGS. 3, 4, 5, and 6 are top plan views respectively showing pixel arrays of unit pixels of the image sensor of FIG. 1 according to some example embodiments, FIG. 7 is a cross-sectional view showing the image sensor of FIG. 1 according to some example embodiments, FIG. 8 is a cross-sectional view showing the image sensor of FIG. 1 according to some example embodiments, and FIG. 9 is a schematic diagram of an electronic device according to some example embodiments.

DETAILED DESCRIPTION

Hereinafter, some example embodiments of the present inventive concepts will be described in detail so that a person skilled in the art would understand the same. This disclosure may, however, be embodied in many different forms and is not construed as limited to the example embodiments set forth herein.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

In the drawings, parts having no relationship with the description are omitted for clarity of the embodiments, and the same or similar constituent elements are indicated by the same reference numeral throughout the specification.

Hereinafter, the terms 'lower' and 'upper' are used for better understanding and ease of description, but do not limit the position relationship.

In the following descriptions, it is described that the light-receiving side is on the image sensor, but this is for the better understanding and ease of description, and does not limit the position relationship.

Hereinafter, an image sensor according to some example embodiments is described.

When the terms "about" or "substantially" are used in this specification in connection with a numerical value, it is intended that the associated numerical value include a tolerance of ±10% around the stated numerical value. When ranges are specified, the range includes all values therebetween such as increments of 0.1%.

FIG. 1 is a schematic top plan view showing one example of a unit pixel of an image sensor according to some example embodiments, FIG. 2 is a cross-sectional view showing one example of the organic CMOS image sensor of FIG. 1, and FIGS. 3, 4, 5, and 6 are top plan views respectively showing pixel arrays of unit pixels of the image sensor of FIG. 1 according to some example embodiments.

Referring to FIG. 1, an image sensor 300 according to some example embodiments includes a device 100 sensing light in a visible wavelength spectrum of light (hereinafter, refer to be a 'visible light sensing device') and a device 200 sensing light in an infrared wavelength spectrum of light (hereinafter, an 'infrared photo-sensing device'). The visible light sensing device 100 and the infrared photo-sensing device 200 are stacked, and the visible light sensing device 100 is disposed nearer to a light-receiving side than the infrared photo-sensing device 200.

The visible light sensing device 100 may for example include a unit pixel having a 2×2 matrix structure, for example, a plurality of pixels (VIS1, VIS2, VIS3, and VIS4) sensing light in the same or different wavelength spectrum of lights in the visible wavelength spectrum of light. However, the unit pixel is not limited thereto but may have various structures such as 3×3 or 4×4.

For example, the visible light sensing device 100 may be a photoelectric conversion device absorbing light in the visible wavelength spectrum of light and thus photoelectrically converting the light.

The plurality of pixels (VIS1, VIS2, VIS3, and VIS4) of the visible light sensing device 100 may be for example independently selected from a red pixel (R) photoelectrically converting light in a red wavelength spectrum of light; a green pixel (G) photoelectrically converting light in a green wavelength spectrum of light; a blue pixel (B) photoelectrically converting light in a blue wavelength spectrum of light; a cyan pixel (C) photoelectrically converting light in the blue wavelength spectrum of light and the green wavelength spectrum of light; a magenta pixel (M) photoelectrically converting light in the blue wavelength spectrum of light and the red wavelength spectrum of light; a yellow pixel (Y) photoelectrically converting light in the green wavelength spectrum of light and the red wavelength spectrum of light; and a white pixel (W) photoelectrically converting light in the blue wavelength spectrum of light, the green wavelength spectrum of light, and the red wavelength spectrum of light.

For example, referring to FIG. 3, a unit pixel of the visible light sensing device 100 may have a RGB array of one red pixel (R), one blue pixel (B), and two green pixels (G).

For example, referring to FIG. 4, the unit pixel of the visible light sensing device 100 may have a RGBW array of one red pixel (R), one blue pixel (B), one green pixel (G), and one white pixel (W).

For example, referring to FIG. 5, the unit pixel of the visible light sensing device 100 may have a CMGY array of one cyan pixel (C), one magenta pixel (M), one green pixel (G), and one yellow pixel (Y).

For example, referring to FIG. 6, the unit of the visible light sensing device 100 may have a CYYM array of one cyan pixel (C), one magenta pixel (M), and two yellow pixels (Y).

An infrared photo-sensing device 200 may include a plurality of pixels in which a photodiode is disposed, and the plurality of pixels having the photodiode may be arranged as a matrix format along a column and/or a row. The photodiode may sense light in an infrared wavelength spectrum of light (IR).

Referring to FIG. 2, the visible light sensing device 100 and the infrared photo-sensing device 200 are stacked and respectively disposed in ("within") and out of a semiconductor substrate 210. Specifically, the visible light sensing device 100 includes a photoelectric conversion device 120 and a color filter layer 110 on the semiconductor substrate 210, and the infrared photo-sensing device 200 includes a photodiode 220 integrated in the semiconductor substrate 210. As shown in FIG. 2, the photodiode 220, is integrated in the semiconductor substrate 210 and thus is "within" the semiconductor substrate 210, as the photodiode 220 is entirely located within a volume of space defined by the outer surfaces of the semiconductor substrate 210, including surface 210a. The photoelectric conversion device 120, the color filter layer 110, and the photodiode 220 may be overlapped (e.g., may overlap in a direction extending orthogonally to surface 210a). Accordingly, as shown in FIG. 2, the color filter layer 110 (including one or more color filters 110a, 110b, and 110c according to some example embodiments), an organic photoelectric conversion device (e.g., the photoelectric conversion device 120 according to some example embodiments), and an inorganic photodiode (e.g., one or more of the photodiodes 220a, 220b, and 220c according to some example embodiments) may be sequentially stacked from a light incidence direction (e.g., a direction extending towards the focusing lenses 330 from the semiconductor substrate 210). As described further herein, the image sensor 300 may include one or more filtering elements, and the color filter layer 110 may be understood to be a filtering element.

The visible light sensing device 100 includes the photoelectric conversion device 120 disposed on the whole ("entire") surface of an image sensor 300 and the color filter layer 110 disposed on the photoelectric conversion device 120. Accordingly, as shown in FIG. 2, the color filter layer 110 may include one or more color filters 110a, 110b, and 110c on the photoelectric conversion device 120 such that the photoelectric conversion device 120 is between the one or more color filters 110a, 110b, and 110c and the semiconductor substrate 210, wherein the one or more color filters 110a, 110b, and 110c are each configured to selectively filter at least a portion of a visible wavelength spectrum of light that the photoelectric conversion device 120 is configured to sense.

The photoelectric conversion device 120 includes lower electrodes 121a, 121b, and 121c and an upper electrode 122 facing each other and a photoelectric conversion layer 123 disposed between the lower electrodes 121a, 121b, and 121c and the upper electrode 122. In some example embodiments, the photoelectric conversion device 120 includes an individual lower electrode (e.g., lower electrode 121a) and an upper electrode 122 (e.g., a pair of electrodes) facing each other and a photoelectric conversion layer 123 between the pair of electrodes.

The lower electrodes 121a, 121b, and 121c may be pixel electrodes and thus, independently operated in each pixel. The upper electrode 122 may be a common electrode and also, a light receiving electrode disposed at a light-receiving side.

The lower electrodes 121a, 121b, and 121c and the upper electrode 122 may be a light-transmitting electrode and the light-transmitting electrode may be for example made of a conductive oxide such as an indium tin oxide (ITO), indium zinc oxide (IZO), zinc oxide (ZnO), tin oxide (SnO), aluminum tin oxide (AITO), and fluorine doped tin oxide (FTO), or a metal thin layer of a single layer or a multilayer, but is not limited thereto.

The photoelectric conversion layer 123 is disposed between the lower electrodes 121a, 121b, and 121c and the upper electrode 122 and formed on the whole surface of the image sensor 300.

The photoelectric conversion layer 123 may include a light absorbing material configured to absorb light in a visible wavelength spectrum of light but not substantially absorbing light (e.g., not absorbing light within manufacturing tolerances and/or material tolerances) in an infrared wavelength spectrum of light. Herein, the visible wavelength spectrum of light may be for example about 380 nm to about 700 nm, the infrared wavelength spectrum of light may include a near infrared wavelength spectrum of light, a mid-infrared wavelength spectrum of light, and a far-infrared wavelength spectrum of light, for example, greater than about 700 nm, for example, greater than or equal to about 750 nm, or for example, greater than or equal to about 780 nm, for example, in the near infrared wavelength spectrum of light, greater than about 700 nm and less than or equal to about 3000 nm, about 750 nm to about 3000 nm, about 780 nm to about 3000 nm, about 800 nm to about 3000 nm, about 800 nm to about 2000 nm, or about 800 nm to about 1000 nm.

In some example embodiments, the photoelectric conversion layer 123 is configured to absorb light in an entirety of a visible wavelength spectrum of light (e.g., a first visible wavelength spectrum of light), and the photoelectric conversion device 120 may be configured to sense a visible wavelength spectrum of light that may be equal to or a limited portion of the entirety of the visible wavelength spectrum of light. As described herein, the photoelectric conversion device 120 may include separate photoelectric conversion regions 120a, 120b, and 120c that are each configured to sense a separate visible wavelength spectrum of light that is a limited portion of the entirety of the visible wavelength spectrum of light. As shown in FIG. 2, the photoelectric conversion device may be configured to photoelectrically convert light in a visible wavelength spectrum of light that passes the color filter layer 110 (e.g., one or more of the color filters 110a, 110b, and 110c).

The photoelectric conversion layer 123 may include one or more kinds of light absorbing material, for example, a light absorbing material configured to absorb light in a whole visible wavelength spectrum of light, or a plurality of light absorbing materials absorbing light in different regions of the visible wavelength spectrum of light. The photoelectric conversion layer 123 may be an organic photoelectric conversion layer that includes at least one organic light absorbing material. Accordingly, the photoelectric conversion device 120 may be an organic photoelectric conversion device.

The photoelectric conversion layer 123 may include a p-type semiconductor and an n-type semiconductor, where the p-type semiconductor and the n-type semiconductor may collectively form ("comprise") a pn junction.

At least one of the p-type semiconductor and the n-type semiconductor may include a light absorbing material capable of absorbing light in at least a part of a visible wavelength spectrum of light, for example a light absorbing material capable of selectively absorbing light in the full ("entire") visible wavelength spectrum of light. For example, at least one semiconductor of the p-type semiconductor and the n-type semiconductor may be an organic light absorbing material. For example, each of the p-type semiconductor and the n-type semiconductor may not include silicon (Si). For example, each semiconductor of the p-type semiconductor and the n-type semiconductor may not substantially absorb light in an infrared wavelength spectrum of light. Restated, each semiconductor of the p-type semiconductor and the n-type semiconductor may be configured to not substantially absorb light in the infrared wavelength spectrum of light.

In some example embodiments, at least one semiconductor of the p-type semiconductor and the n-type semiconductor includes a light absorbing material configured to absorb light in at least a part of the visible wavelength spectrum of light, and the at least one semiconductor of the p-type semiconductor and the n-type semiconductor are collectively configured to absorb light in an entirety of the visible wavelength spectrum of light.

For example, the p-type semiconductor may include at least one light absorbing material configured to absorb light in at least a part of the visible wavelength spectrum of light, for example, a light absorbing material configured to absorb light in the whole visible wavelength spectrum of light or in different regions of the visible wavelength spectrum of light. For example, at least one of the p-type semiconductors may be an organic light absorbing material.

The p-type semiconductor may include for example at least one selected from a thiophene compound such as poly-3-hexyl thiophene, poly-3-butyl thiophene; a phenylenevinylene compound such as poly[2-methyl, 5-(3',7'-dimethyloctyloxy)]-1,4-phenylenevinylene (MDMOPPV), poly[2-methoxy, 5-(2-ethyl-hexyloxy)-1,4-phenylvinylene] (MEH-PPV); a fluorene compound such as poly[2,7-(9,9-dioctyl-fluorene)-alt-5,5(2,3,6,7-tetraphenyl-9,10-dithien-2-yl pyrazino[2,3-g]quinoxaline)], poly[2,7-(9,9-dioctyl fluorene)-alt-5,5-(2,3-bis(4-(2-ethylhexyloxy)phenyl)-5,7-di (thiophene-2-yl)thieno[3,4-b]pyrazine)]), and the like; a benzothiadiazole compound such as poly[N-9"-hepta-decanyl-2,7-carbazole-alt-5,5-(4',7'-di-2-thienyl-2',1',3'-benzothiadiazole) (PCDTBT), [2,6-(4,4-bis(2-ethylhexyl)-4H-cyclopenta[2,1-b;3,4-b']-dithiophene)-alt-4,7-(2,1,3-benzothiadiazole)] (PCPDTBT), and the like; phthalocyanine including a coordinated center metal of Cu, Fe, Co, Ni, and the like, a phthalocyanine compound such as metal-free phthalocyanine, aluminum chlorophthalocyanine, indium phthalocyanine, or gallium phthalocyanine; anthracene; tetracene; pentacene; a hydrazone compound; a pyrazoline compound; a triphenylmethane compound; triphenylamine compound; and a copolymer thereof, but is not limited thereto.

The p-type semiconductor may include for example at least one of a light absorbing material configured to absorb light in a red wavelength spectrum of light, a light absorbing material configured to absorb light in a green wavelength spectrum of light, and a light absorbing material configured to absorb light in a blue wavelength spectrum of light.

For example, the n-type semiconductor may be a light absorbing material that absorbs at least one part of a visible wavelength spectrum of light, for example fullerene such as C60, C70, C71, C74, C76, C78, C82, C84, C720 or C860; non-fullerene; thiophene; a derivative thereof; or a combination thereof. The fullerene derivative may be for example [6,6]-phenyl-C61-butyric acid methyl ester (PCBM), [6,6]-phenyl-C71-butyric acid methyl ester, and the like, but is not limited thereto. For example, the n-type semiconductor may include fullerene or a fullerene derivative.

For example, at least one p-type semiconductor and an n-type semiconductor may be combined to absorb light in a full visible wavelength spectrum of light (e.g., an entirety of the visible wavelength spectrum of light).

For example, the p-type semiconductor may be at least one organic light absorbing material and the n-type semiconductor may be fullerene or a fullerene derivative. Accordingly, the photoelectric conversion layer 123 may include 1) an organic light absorbing material and 2) fullerene or a fullerene derivative.

The photoelectric conversion layer 123 may include a p-type semiconductor and an n-type semiconductor that are mixed in a particular (or, alternatively, predetermined) ratio to provide a bulk heterojunction structure and the p-type semiconductor and the n-type semiconductor may be for example included in a volume ratio of about 1:100 to about 100:1, about 1:50 to about 50:1, about 1:10 to about 10:1, about 1:5 to about 5:1, or about 1:1. For example, the n-type semiconductor may be included in the same amount as or a greater amount than the p-type semiconductor. Restated, the photoelectric conversion layer 123 may include an amount of the n-type semiconductor that is equal or greater than an amount of the p-type semiconductor in the photoelectric conversion layer 123. For example, in the intrinsic layer (I layer), the p-type semiconductor and the n-type semiconductor may be included in a volume ratio of about 1:1 to about 1:10.

The photoelectric conversion layer 123 may include a p-type layer including the p-type semiconductor and an n-type layer including the n-type semiconductor. The p-type layer may include the p-type semiconductor and the n-type layer may include the n-type semiconductor. For example, a thickness of the n-type layer may be the same as or larger than that of the p-type layer, and for example a thickness ratio of the p-type layer and the n-type layer may range from about 1:1 to about 1:10.

The photoelectric conversion layer 123 may be various combinations of an intrinsic layer (I layer), a p-type layer/an n-type layer, a p-type layer/an I layer, an I layer/an n-type layer, a p-type layer/an I layer/an n-type layer, and the like. Herein, the intrinsic layer may be a mixed layer of the p-type semiconductor and the n-type semiconductor.

The photoelectric conversion layer 123 may have a thickness of about 1 nm to about 500 nm. Within the range, the photoelectric conversion layer 123 may have for example a thickness of about 5 nm to about 300 nm, for example about 5 nm to about 200 nm.

The photoelectric conversion layer 123 absorbs light in a visible wavelength spectrum of light to produce excitons, separates the produced excitons into holes and electrons, and then separated holes are transported into an anode that is one of the lower electrodes 121a, 121b, and 121c and the upper electrode 122 and separated electrons are transported into a cathode that is the other of the lower electrode 121a, 121b, and 121c and the upper electrode 122 to exhibit a photoelectric conversion effect. The separated electrons and/or holes may be collected in charge storages 230a, 230b, and 230c.

The photoelectric conversion device 120 may further include an auxiliary layer (not shown) disposed between the lower electrodes 121a, 121b, and 121c and the photoelectric conversion layer 123 and/or between the upper electrode 122 and the photoelectric conversion layer 123. The auxiliary layer may be a charge auxiliary layer, a light absorbing auxiliary layer, or a combination thereof, but is not limited thereto.

The auxiliary layer may include for example at least one selected from a hole injection layer for facilitating hole injection, a hole transport layer for facilitating hole transport, an electron blocking layer for preventing electron transport, an electron injection layer for facilitating electron injection, an electron transport layer for facilitating electron transport, and a hole blocking layer for preventing hole transport.

The auxiliary layer may include for example an organic material, an inorganic material, or an organic/inorganic material. The organic material may be an organic material having hole or electron characteristics and the inorganic material may be for example a metal oxide such as a molybdenum oxide, a tungsten oxide, or a nickel oxide, but is not limited thereto.

The photoelectric conversion device 120 may have a thickness of less than or equal to about 1.5 μm, and within the range, for example, less than or equal to about 1.2 μm, or for example, less than or equal to about 1.0 μm.

The color filter layer 110 is disposed on the photoelectric conversion device 120 and includes color filters 110a, 110b, and 110c disposed in each pixel. As shown in FIG. 2, the color filters 110a, 110b, and 110c may be on the photoelectric conversion device 120, such that the photoelectric conversion device 120 is between the color filters 110a, 110b, and 110c and the semiconductor substrate 210. The color filters 110a, 110b, and 110c may separate light flowing into the photoelectric conversion device 120 depending on a wavelength and thus transmit light in a particular (or, alternatively, predetermined) wavelength spectrum of light.

The color filters 110a, 110b, and 110c may transmit light in a visible wavelength spectrum of light and an infrared wavelength spectrum of light, and each color filter 110a, 110b, and 110c may transmit light in the same or different wavelength spectrum of light out of the visible wavelength spectrum of light.

For example, the color filters 110a, 110b, and 110c may independently pass light of at least one of a blue wavelength spectrum of light, a green wavelength spectrum of light, and a red wavelength spectrum of light and commonly light in an infrared wavelength spectrum of light. Restated, each color filter of the color filters 110a, 110b, and 110c may be configured to transmit 1) light in at least one wavelength spectrum of light of a red wavelength spectrum of light, a green wavelength spectrum of light, and a blue wavelength spectrum of light, and 2) light in an infrared wavelength spectrum of light.

Herein, the blue wavelength spectrum of light may be in a range of about 380 nm to about 490 nm, the green wavelength spectrum of light may be for example in a range of about 500 nm to about 600 nm, and the red wavelength spectrum of light may be in a range of about 610 nm to about 700 nm. In addition, herein, the infrared wavelength spectrum of light may include a near infrared wavelength spectrum of light, a mid-infrared wavelength spectrum of light, and a far-infrared wavelength spectrum of light, for example, greater than about 700 nm, for example, greater than or equal to about 750 nm, or for example greater than or equal to about 780 nm, for example, the near infrared wavelength spectrum of light, for example, greater than about 700 nm and less than or equal to about 3000 nm, about 750 nm to about 3000 nm, about 780 nm to about 3000 nm, about 800 nm to about 3000 nm, about 800 nm to about 2000 nm, or about 800 nm to about 1000 nm. In addition, herein, the 'transmission' may indicate average light transmittance of greater than or equal to about 60%, greater than or equal to about 65%, greater than or equal to about 70%, greater than or equal to about 75%, or greater than or equal to about 80% in each wavelength spectrum of light. Accordingly, for example, at least one color filter of the plurality of color filters 110a, 110b, 110c may have an average light transmittance of greater than or equal to about 70% in an infrared wavelength spectrum of light of about 800 nm to about 1000 nm. In addition, herein, the 'selective transmission' may indicate that transmittance in a particular wavelength spectrum of light out of the visible wavelength spectrum of light is remarkably higher than transmittance in the other wavelength spectrum of lights of the visible wavelength spectrum of light, for example, greater than or equal to about twice, greater than or equal to about three times, greater than or equal to about 4 times, or greater than or equal to about 5 times higher than transmittance in the other wavelength spectrum of lights of the visible wavelength spectrum of light.

For example, each color filter 110a, 110b, and 110c may pass light in at least one of blue, green, and red wavelength spectrum of lights greater than or equal to about twice, greater than or equal to about 3 times, greater than or equal to about 4 times, or greater than or equal to about 5 times as high as in other wavelength spectrum of lights of the visible wavelength spectrum of light, and the infrared wavelength spectrum of light of the color filters 110a, 110b, and 110c, for example, a region of about 800 nm to 1000 nm may have average light transmittance of greater than or equal to about 60%, greater than or equal to about 65%, greater than or equal to about 70%, greater than or equal to about 75%, or greater than or equal to about 80%.

For example, each color filter 110a, 110b, and 110c may be selected from a blue filter selectively transmitting light in a blue wavelength spectrum of light and in an infrared wavelength spectrum of light; a green filter selectively transmitting light in a green wavelength spectrum of light and in the infrared wavelength spectrum of light; and a red filter selectively transmitting light in a red wavelength spectrum of light and in the infrared wavelength spectrum of light.

For example, each color filter 110a, 110b, and 110c may be selected from a cyan filter selectively transmitting light in a blue wavelength spectrum of light, a green wavelength spectrum of light, and an infrared wavelength spectrum of light; a magenta filter selectively transmitting light in the blue wavelength spectrum of light, a red wavelength spectrum of light, and the infrared wavelength spectrum of light; a yellow filter selectively transmitting light in the green wavelength spectrum of light, the red wavelength spectrum of light, and the infrared wavelength spectrum of light; and a white filter selectively transmitting light in the blue wavelength spectrum of light, the green wavelength spectrum of light, the red wavelength spectrum of light, and the infrared wavelength spectrum of light.

For example, the color filter layer 110 may include at least one blue filter, at least one green filter, and at least one red filter.

For example, the color filter layer 110 may include at least one blue filter, at least one green filter, at least one red filter, and at least one white filter.

For example, the color filter layer 110 may include at least one cyan filter, at least one magenta filter, and at least one yellow filter.

For example, the color filter layer 110 may include at least one cyan filter, at least one magenta filter, at least one yellow filter, and at least one white filter.

For example, the color filter layer 110 may include at least one of a blue filter, a green filter, and a red filter and at least one of a cyan filter, a magenta filter, and a yellow filter.

For example, the color filter layer 110 may include at least one of a blue filter, a green filter, a red filter a cyan filter, a magenta filter, a yellow filter, and a white filter.

The photoelectric conversion device 120 may include a plurality of photoelectric conversion regions 120a, 120b, and 120c corresponding to each pixel. Each photoelectric conversion region 120a, 120b, and 120c may be defined as a region partitioned by lower electrodes 121a, 121b, and 121c, the photoelectric conversion layer 123, the upper electrode 122, and the color filters 110a, 110b, and 110c and correspond to one of pixels (VIS1, VIS2, VIS3, VIS4) shown in FIG. 1.

For example, the photoelectric conversion device 120 may include a first photoelectric conversion region 120a defined by a region where the lower electrode 121a, the photoelectric conversion layer 123, the upper electrode 122, and the color filter 110a are overlapped; a second photoelectric conversion region 120b defined by a region where the lower electrode 121b, the photoelectric conversion layer 123, the upper electrode 122, and the color filter 110b are overlapped; and a third photoelectric conversion region 120c defined by a region where the lower electrode 121c, the photoelectric conversion layer 123, the upper electrode 122, and the color filter 110c are overlapped.

In some example embodiments, each separate photoelectric conversion region 120a, 120b, and 120c may be understood to be a separate photoelectric conversion device configured to sense light in a visible wavelength spectrum of light, where each separate photoelectric conversion device includes a pair of electrodes (upper electrode 122 and a separate electrode of lower electrodes 121a to 121c) facing each other and a photoelectric conversion layer 123 between the pair of electrodes, where the photoelectric conversion layer 123 is configured to selectively absorb light in a visible wavelength spectrum of light. As shown in FIG. 2, each separate photoelectric conversion region 120a to 120c may include a separate color filter 110a to 110c which may be configured to selectively transmit a different visible wavelength spectrum of light. Accordingly, while the photoelectric conversion layer 123 of each photoelectric conversion region 120 may be configured to selectively absorb light in a first visible wavelength spectrum of light, each separate photoelectric conversion region 120 may be configured to sense light in a separate visible wavelength spectrum of light that is a separate, limited portion of the first wavelength spectrum of visible light. In some example embodiments, for example where a photoelectric conversion region 120 includes a color filter 110 (e.g., a white color filter) that is configured to transmit an entirety of the visible wavelength spectrum of light that the photoelectric conversion layer 123 is configured to selectively absorb, the photoelectric conversion region 120 may be configured to sense light in an entirety of the same visible wavelength spectrum of light that the photoelectric conversion layer is configured to selectively absorb.

Which one of the first to third photoelectric conversion regions 120a, 120b, and 120c is photoelectrically converted into a visible ray wavelength spectrum of light may be determined by light selectively transmitted by the color filters 110a, 110b, and 110c.

For example, when the color filter 110a is a blue filter, the photoelectric conversion layer 123 of the first photoelectric conversion region 120a may be selectively supplied with light in a blue wavelength spectrum of light of the visible wavelength spectrum of light and thus absorb and photoelectrically convert it.

For example, when the color filter 110b is a green filter, the photoelectric conversion layer 123 of the second photoelectric conversion region 120b may be supplied with light in a green wavelength spectrum of light of the visible wavelength spectrum of light and thus selectively absorb and photoelectrically convert it.

For example, when the color filter 110c is a red filter, the photoelectric conversion layer 123 of the third photoelectric conversion region 120c may be supplied with light in a red wavelength spectrum of light of the visible wavelength spectrum of light and thus selectively absorb and photoelectrically convert it.

For example, when the color filter 110a is a cyan filter, the photoelectric conversion layer 123 of the first photoelectric conversion region 120a may be supplied with light in blue and green wavelength spectrum of lights of the visible wavelength spectrum of light and thus absorb and photoelectrically convert it.

For example, when the color filter 110b is a magenta filter, the photoelectric conversion layer 123 of the second photoelectric conversion region 120b may be supplied with light in blue and red wavelength spectrum of lights of the visible wavelength spectrum of light and thus absorb and photoelectrically convert it.

For example, when the color filter 110c is a yellow filter, the photoelectric conversion layer 123 of the third photoelectric conversion region 120c may be supplied with light in green and red wavelength spectrum of lights of the visible region and thus absorb and photoelectrically convert it.

Accordingly, the first to third photoelectric conversion regions 120a, 120b, and 120c may photoelectrically convert light in the same or different visible ray wavelength spectrum of light one another depending on the color filters 110a, 110b, and 110c.

The infrared photo-sensing device 200 may be disposed beneath the visible light sensing device 100 and thus sense light in an infrared wavelength spectrum of light passing the visible light sensing device 100. As described above, light in the visible ray is absorbed and photoelectrically converted in the visible light sensing device 100 and thus not supplied to the infrared photo-sensing device 200.

The infrared photo-sensing device 200 may be photodiodes 220a, 220b, and 220c integrated in the semiconductor substrate 210, and the photodiodes 220a, 220b, and 220c may be overlapped with the color filters 110a, 110b, and 110c. One or more of the photodiodes 220a, 220b, and 220c may be an inorganic photodiode. The photodiodes 220a, 220b, and 220c may sense light passing the color filters 110a, 110b, and 110c and the photoelectric conversion device 120 in each pixel and independently light in an infrared wavelength spectrum of light. Restated, one or more of the photodiodes 220a, 220b, and 220c may be configured to sense light in an infrared wavelength spectrum of light. For example, as described above, each color filter 110a, 110b, and 110c may transmit light in a part of the visible wavelength spectrum of light and an infrared wavelength spectrum of light, the light in the visible wavelength spectrum of light passing each color filter 110a, 110b, and 110c may be respectively absorbed in the photoelectric conversion layer 30 of each photoelectric conversion region 120a, 120b, and 120c, and accordingly, the photodiode 220a, 220b, and 220c may sense light in an infrared wavelength spectrum of light. The infrared wavelength spectrum of light may be a limited portion of an entirety of an infrared wavelength spectrum of light (e.g., may be a near-infrared wavelength spectrum of light instead of a combination of near-infrared and far-infrared wavelength spectra of light).

The semiconductor substrate 210 may be an inorganic semiconductor substrate, for example, a silicon substrate or an InGaAs substrate. The photodiodes 220a, 220b, and 220c may be disposed deep enough to sense light in an infrared wavelength spectrum of light in the semiconductor substrate 210, for example, the depth may be at least partially in a range of about 0 nm to about 7000 nm from the surface of the semiconductor substrate 210. Restated, and as shown in at least FIG. 2, one or more of the photodiodes 220a, 220b, and 220c may be at least partially within the semiconductor substrate 210 at a depth of about 0 nm to about 7000 nm from a surface 210a of the semiconductor substrate 210.

The charge storages 230a, 230b, and 230c and transmission transistor (not shown) are also in the semiconductor substrate 210. The charge storages 230a, 230b, and 230c may be electrically connected to each of the photoelectric conversion regions 120a, 120b, and 120c of the photoelectric conversion device 120 to transfer information to the transmission transistor and the transmission transistor may receive information from the photodiodes 220a, 220b, and 220c and the charge storages 230a, 230b, and 230c.

A metal wire (not shown) and a pad (not shown) are formed on or under the semiconductor substrate 210. In order to decrease signal delay, the metal wire and pad may be made of a metal having low resistivity, for example, aluminum (Al), copper (Cu), silver (Ag), and alloys thereof, but are not limited thereto.

An insulation layer 310 may be formed between the semiconductor substrate 210 and the photoelectric conversion device 120. The insulation layer 310 may include an organic, inorganic, and/or organic/inorganic insulating material, for example an inorganic insulating material such as a silicon oxide and/or a silicon nitride, or a low dielectric constant (low K) material such as SiC, SiCOH, SiCO, and SiOF. The insulation layer 310 may be for example a transparent insulation layer. The insulation layer 310 has a trench exposing the charge storages 230a, 230b, and 230c. The trench may be filled with fillers.

A focusing lens 330 may be formed on the photoelectric conversion device 120. The focusing lens 330 may control a direction of incident light and gather the light in one region. The focusing lens 330 may have a shape of, for example, a cylinder or a hemisphere, but is not limited thereto.

A planarization layer 320 is formed under the focusing lens 330. The planarization layer 320 eliminates steps of the color filter layer 110 and planarizes it. The planarization layer 320 may include an organic, inorganic, and/or organic/inorganic insulating material. The planarization layer 320 may be omitted.

A bandpass filter 340 is on the focusing lens 330. The bandpass filter 340 may be configured to selectively transmit light in a particular (or, alternatively, predetermined) wavelength spectrum of light, for example, light in the visible wavelength spectrum of light and an infrared wavelength spectrum of light.

For example, the bandpass filter 340 may transmit light in the whole visible wavelength spectrum of light and the whole infrared wavelength spectrum of light.

For example, the bandpass filter 340 may selectively transmit light in the whole visible ray and light in a near-infrared wavelength spectrum of light, which may be a limited portion of the entirety of the infrared wavelength spectrum of light.

For example, the bandpass filter 340 may selectively transmit light in the whole visible ray and light in a particular (or, alternatively, predetermined) wavelength spectrum of light of the infrared wavelength spectrum of light. Herein, the particular (or, alternatively, predetermined) wavelength spectrum of light of the infrared wavelength spectrum of light may be determined depending on use of an image sensor 300, for example, belong to a wavelength spectrum of light of about 780 nm to about 1000 nm within the range, for example, a wavelength spectrum of light of about 780 nm to about 900 nm within the range, for example, a wavelength spectrum of light of about 780 nm to about 840 nm within the range, for example, a wavelength spectrum of light of about 800 nm to about 830 nm within the region, for example, a wavelength spectrum of light of about 805 nm to about 815 nm within the range, for example, a wavelength spectrum of light of about 810 nm, and according to some example embodiments, for example, a wavelength spectrum of light of about 780 nm to about 1000 nm, for example, a wavelength spectrum of light of about 830 nm to about 1000 nm within the range, for example, a wavelength spectrum of light of about 910 nm to about 970 nm within the range, for example, a wavelength spectrum of light of about 930 nm to about 950 nm within the range, for example, a wavelength spectrum of light of about 935 nm to about 945 nm within the range, and for example, a wavelength spectrum of light of about 940 nm within the range.

In the drawing, a structure of the bandpass filter 340 on the focusing lens 330 is shown, but the bandpass filter 340 may be beneath the focusing lens 330.

It will be understood herein that an element that is "on" another element may be above or beneath the other element, and may be "directly" on (e.g., in contact with) or "indirectly" on (e.g., spaced apart from with an interposing element and/or space) the other element.

As described further herein, the image sensor 300 may include one or more filtering elements, and the bandpass filter 340 may be understood to be a filtering element.

Am image sensor according to some example embodiments has a structure that a visible light sensing device absorbing and photoelectrically converting light in a visible wavelength spectrum of light and an infrared photo-sensing device sensing light in an infrared wavelength spectrum of light are stacked and thus may realize a high sensitivity image sensor without adding a separate infrared light-sensing pixel under a low illumination environment.

In addition, the image sensor according to some example embodiments has a structure that a visible light sensing device absorbing and photoelectrically converting light in a visible wavelength spectrum of light and an infrared photo-sensing device sensing light in an infrared wavelength spectrum of light are stacked and thus may realize a composite sensor including sensors performing different functions one another without increasing a size of the image sensor, for example, a composite sensor including an image sensor using the visible light sensing device, an iris sensor using the infrared photo-sensing device, or a depth sensor.

In addition, the image sensor according to some example embodiments has a structure that the visible light sensing device and the infrared photo-sensing device are stacked wherein the visible light sensing device is disposed near to a light-receiving side to reduce an influence of the infrared photo-sensing device on the visible light sensing device and/or an influence of the visible light sensing device on the infrared photo-sensing device and thus may improve performance of the image sensor.

Specifically, as for a photodiode having a structure that the infrared photo-sensing device is disposed nearer to the light-receiving side than the visible light sensing device, for example, that the infrared photo-sensing device is a photoelectric conversion device, and the visible light sensing device is integrated in a semiconductor substrate, at least a part of a p-type semiconductor and/or an n-type semiconductor included in a photoelectric conversion layer of the photoelectric conversion device may inevitably use a light absorbing material configured to absorb light in a visible wavelength spectrum of light and thus reduce light in the visible wavelength spectrum of light flowing in the photodiode. Particularly, when a fullerene or fullerene derivative is used as the n-type semiconductor included in the photoelectric conversion layer, the light in a blue wavelength spectrum of light flowing into the photodiode due to light-blue wavelength spectrum of light absorption characteristics of the fullerene or fullerene derivative is reduced, and thus optical performance of the image sensor may be deteriorated.

In addition, when an amount of the light absorbing material configured to absorb light in a visible wavelength spectrum of light is decreased in the infrared photo-sensing device in order to prevent the performance degradation of the image sensor, electric characteristics of the infrared photo-sensing device are deteriorated, and thus electrical performance of the image sensor also may be deteriorated.

Accordingly, the image sensor according to some example embodiments has a structure that the visible light sensing device is disposed near to a light-receiving side shows improved color image quality and an increased operation speed of an infrared light signal compared with its opposite structure, that is, a structure that the infrared photo-sensing device is nearer to the light-receiving side than the visible light sensing device. Accordingly, optical and electrical performance of the image sensor may be improved and thus realize a high performance image sensor.

In addition, the image sensor of some example embodiments includes an organic photoelectric conversion layer on a semiconductor substrate as a visible light sensing device may largely reduce a thickness of the visible light sensing device and thus an optical crosstalk compared with a structure of including the visible light sensing device including an inorganic semiconductor such as silicon (Si).

Specifically, as for an image sensor having a structure of stacking an inorganic visible light sensing device including an inorganic semiconductor and an inorganic infrared photo-sensing device including an inorganic semiconductor, an absorption coefficient of the inorganic semiconductor is a lot changed depending on a wavelength, light in a different wavelength spectrum of light is absorbed depending on a depth of the inorganic semiconductor, and accordingly, a very thick thickness of greater than or equal to about 4 µm may be required to absorb light of all the wavelengths including red, green and blue wavelength spectrum of lights in the visible wavelength spectrum of light. In addition, the focusing lens, the inorganic visible light sensing device, and the inorganic infrared photo-sensing device have a wider distance among themselves due to this thick thickness, incident light controlled from the focusing lens do not effectively reach the inorganic visible light sensing device and the inorganic infrared photo-sensing device and thus generates an optical crosstalk. Accordingly, performance of the image sensor may be deteriorated.

On the contrary, a visible light sensing device including an organic photoelectric conversion layer has a thickness of less than or equal to about 1.5 µm, for example, less than or equal to about 1 µm but may effectively absorb light of all the wavelength in the visible wavelength spectrum of light, thus reduce an optical crosstalk as well as realize a thin image sensor, and resultantly, realize a high performance image sensor.

In some example embodiments, the infrared photo-sensing device 200 will be understood to be a device including one or more photodiodes configured to sense (e.g., selectively absorb) light in a first wavelength spectrum of light, and the visible light sensing device 100 will be understood to be a device including a photoelectric conversion device configured to sense (e.g., selectively absorb) light in a second wavelength spectrum of light. As shown in FIG. 2, the first wavelength spectrum of light may be an infrared wavelength spectrum of light, and the second wavelength spectrum of light may be a visible wavelength spectrum of light. However, it will be understood that, in some example embodiments, one or more photodiodes 220a, 220b, 220c may be configured to sense light in a first wavelength spectrum of light that is not an infrared wavelength spectrum of light (e.g., a visible wavelength spectrum of light, an ultraviolet wavelength spectrum of light, some combination thereof, or the like), and the photoelectric conversion device 120 may be configured to sense light in a second wavelength spectrum of light that is not a visible wavelength spectrum of light (e.g., an infrared wavelength spectrum of light, an ultraviolet wavelength spectrum of light, some combination thereof, or the like).

FIG. 7 is a cross-sectional view showing another example of the image sensor of FIG. 1.

The image sensor 300 according to some example embodiments includes the visible light sensing device 100 and the infrared photo-sensing device 200, and herein, the visible light sensing device 100 includes the photoelectric conversion device 120 including the lower electrodes 121a, 121b, and 121c, the upper electrode 122, and the photoelectric conversion layer 123; and the color filter layer 110 including the color filters 110a, 110b, and 110c, and the infrared photo-sensing device 200 includes the photodiodes 220a, 220b, and 220c integrated in the semiconductor substrate 210, like the example embodiments shown in FIG. 2. In addition, the image sensor 300 according to some example embodiments includes the charge storages 230a, 230b, and 230c, the insulation layer 310, the planarization layer 320, the focusing lens 330, and the bandpass filter 340 like the example embodiments shown in FIG. 2.

However, the image sensor 300 according to some example embodiments further includes a visible light blocking film 350 disposed between the semiconductor substrate 210 and the photoelectric conversion device 120.

The visible light blocking film 350 absorbs and/or reflects light in a visible wavelength spectrum of light and thus may prevent an inflow of extra visible light into the photodiodes 220a, 220b, and 220c of the semiconductor substrate 210. The visible light blocking film 350 may be for example a light-blocking film called to be a black matrix.

The visible light blocking film 350 may be formed on the whole surface 210a ("an entirety of the surface 210a) of the semiconductor substrate 210 or as an island corresponding to the photodiodes 220a, 220b, and 220c per each pixel.

As described further herein, the image sensor 300 may include one or more filtering elements, and the visible light blocking film 350 may be understood to be a filtering element.

FIG. 8 is a cross-sectional view showing another example of the image sensor of FIG. 1.

The image sensor 300 according to some example embodiments includes the visible light sensing device 100 and the infrared photo-sensing device 200 similar to the example embodiments of the image sensor 300 described above with reference to FIG. 2, and herein, the visible light sensing device 100 includes the photoelectric conversion device 120 including the lower electrodes 121a, 121b, and 121c, the upper electrode 122, and the photoelectric conversion layer 123; and the infrared photo-sensing device 200 includes the color filter layer 110 including the color filters 110a, 110b, and 110c and the photodiode 220a, 220b, and 220c integrated in the semiconductor substrate 210. In addition, the image sensor 300 according to some example embodiments includes the charge storages 230a, 230b, and 230c, the insulation layer 310, the planarization layer 320, the focusing lens 330, and the bandpass filter 340, similarly to the example embodiments of the image sensor 300 described above with reference to FIG. 2.

However, the image sensor 300 according to some example embodiments further includes a transflective layer 360 between the semiconductor substrate 210 and the photoelectric conversion device 120.

The transflective layer 360 may be configured to selectively reflect light in at least one part of a visible wavelength spectrum of light but transmit light in an infrared wavelength spectrum of light and thus may prevent an inflow of extra visible light into the photodiodes 220a, 220b, and 220c of the semiconductor substrate 210. The reflected light of a visible wavelength spectrum of light by the transflective layer 360 is reabsorbed in the photoelectric conversion layer 123 of the photoelectric conversion device 120 and thus may increase optical efficiency of the photoelectric conversion device 120.

As described further herein, the image sensor 300 may include one or more filtering elements, and the transflective layer 360 may be understood to be a filtering element.

The transflective layer 360 may be formed in each place corresponding to the photodiodes 220a, 220b, and 220c in each pixel. The transflective layer 360 may have the same thickness or a different thickness in each pixel. When the transflective layer 360 may have a different thickness in each pixel, the thickness of the transflective layer 360 in each pixel may be determined depending on a light-reflected visible wavelength spectrum of light. For example, the transflective layer 360 may have a thicker thickness in a red pixel than in green and blue pixels and in addition, in the green pixel than in the blue pixel but is not limited thereto.

The transflective layer 360 selectively reflects light of a red wavelength spectrum of light in the red pixel, the reflected light is reabsorbed in the photoelectric conversion layer 123 of the red pixel, light of a green wavelength spectrum of light is selectively reflected by the transflective layer 360 in the green pixel and thus reabsorbed in the photoelectric conversion layer 123 of the green pixel, and light in a transflective layer 360 is selectively reflected and thus reabsorbed in the photoelectric conversion layer 123 of the blue pixel. Accordingly, the photoelectric conversion device 120 may increase optical efficiency.

The transflective layer 360 may for example have a distributed Bragg reflection (DBR) structure but is not limited thereto. The transflective layer 360 may for example have a structure that a high refractive index film and a low refractive index film are alternately stacked, and the high refractive index film may for example have a refractive index of about 2.0 to about 2.8, and the low refractive index film may for example have a refractive index of about 1.1 to about 1.8 and include about 5 layers to about 50 layers but is not limited thereto. The high refractive index film and the low refractive index film may independently include oxide, nitride, and/or oxynitride, for example, the high refractive index film may include titanium oxide, and the low refractive index film may include silicon oxide but is not limited thereto. The high refractive index film and the low refractive index film may have a thickness determined depending on a refractive index and a reflection wavelength, for example, respectively in a range of about 10 nm to about 300 nm.

While the image sensors 300 shown in FIGS. 2, 7-8 include the color filter layer 110 and bandpass filter 340, it will be understood that in some example embodiments, the image sensor 300 may omit one more of the color filter layer 110, bandpass filter 340, visible light blocking film 350, and transflective layer 360. In addition, in some example embodiments, the image sensor 300 may include one more of the color filter layer 110, bandpass filter 340, visible light blocking film 350, and transflective layer 360 in various relative positions, in relation to the semiconductor substrate 210, that are different from the relative positions shown in at least FIGS. 2, 7-8.

As described herein, each of the color filter layer 110 (including one or more color filters 110a, 110b, and 110c), the bandpass filter 340, the visible light blocking film 350, and the transflective layer 360 may be referred to as being a "filtering element." As described herein, a "filtering element" may be configured to selectively transmit at least a portion of an infrared wavelength spectrum of light (including at least a portion of an infrared wavelength spectrum of light that the one or more photodiodes 220a, 220b, and 220c are configured to sense) and a visible wavelength spectrum of light (including at least a portion of the visible wavelength spectrum of light that the photoelectric conversion device 120 is configured to sense). It will be understood that a "filtering element" as described herein may be configured to selectively transmit only some or all of an infrared wavelength spectrum of light that one or more photodiodes 220a, 220b, and 220c are configured to sense and not any light in any visible wavelength spectrum of light that the photoelectric conversion device 120 is configured to sense, or may be configured to selectively transmit only a portion of a visible wavelength spectrum of light that the photoelectric conversion device 120 is configured to sense and not any light in any infrared wavelength spectrum of light that one or more photodiodes 220a, 220b, and 220c are configured to sense.

FIG. 9 is a schematic diagram of an electronic device 1100 according to some example embodiments.

As shown in FIG. 9, an electronic device 1100 may include a processor 1120, a memory 1130, and an image sensor 1140 that are electrically coupled together via a bus 1110. The image sensor 1140 may be an image sensor of any of the example embodiments as described herein. The memory 1130, which may be a non-transitory computer readable medium, may store a program of instructions. The processor 1120 may execute the stored program of instructions to perform one or more functions. For example, the processor 1120 may be configured to process electric signals generated by the image sensor 1140. The processor 1120 may be configured to generate an output (e.g., an image to be displayed on a display interface) based on processing the electric signals.

While this disclosure has been described in connection with what is presently considered to be practical example embodiments, it is to be understood that the inventive concepts is not limited to the disclosed embodiments, but, on the contrary, is intended to cover various modifications and equivalent arrangements included within the spirit and scope of the appended claims.

What is claimed is:
1. An image sensor, comprising:
   a photodiode within a semiconductor substrate, the photodiode configured to sense infrared light, the infrared light being light in an infrared wavelength spectrum of light;
   a photoelectric conversion device on the semiconductor substrate, the photoelectric conversion device configured to sense light in a visible wavelength spectrum of light, the photoelectric conversion device including
      a pair of electrodes facing each other, and
      a photoelectric conversion layer between the pair of electrodes, the photoelectric conversion layer configured to selectively absorb light in the visible wavelength spectrum of light;
   a plurality of color filters on the photoelectric conversion device, such that the photoelectric conversion device is between the plurality of color filters and the semiconductor substrate;
   a transparent insulation layer between the semiconductor substrate and the photoelectric conversion device; and
   a visible light blocking film between the semiconductor substrate and the photoelectric conversion device such that the visible light blocking film is between the photoelectric conversion device and the photodiode within the semiconductor substrate, the visible light blocking film further between the semiconductor substrate and the transparent insulation layer, the visible light blocking film configured to absorb and/or reflect visible light, the visible light blocking film overlapping at least an entirety of the photodiode, such that the visible light blocking film is configured to selectively transmit the infrared light to the photodiode,
   wherein at least one color filter of the plurality of color filters has an average light transmittance of greater than or equal to about 70% in an infrared wavelength spectrum of light of about 800 nm to about 1000 nm.
2. The image sensor of claim 1, wherein the photoelectric conversion layer is configured to absorb light in an entirety of the visible wavelength spectrum of light.
3. The image sensor of claim 1, wherein
   the photoelectric conversion layer includes a p-type semiconductor and an n-type semiconductor, and
   the n-type semiconductor includes fullerene or a fullerene derivative.

4. The image sensor of claim 3, wherein
at least one semiconductor of the p-type semiconductor and the n-type semiconductor includes a light absorbing material configured to absorb light in at least a part of the visible wavelength spectrum of light, and
the p-type semiconductor and the n-type semiconductor are collectively configured to absorb light in an entirety of the visible wavelength spectrum of light.

5. The image sensor of claim 3, wherein each semiconductor of the p-type semiconductor and the n-type semiconductor is configured to not substantially absorb light in the infrared wavelength spectrum of light.

6. The image sensor of claim 3, wherein the photoelectric conversion layer includes an amount of the n-type semiconductor that is equal or greater than an amount of the p-type semiconductor in the photoelectric conversion layer.

7. The image sensor of claim 1, wherein the photoelectric conversion layer is an organic photoelectric conversion layer that includes at least one organic light absorbing material.

8. The image sensor of claim 1, wherein each color filter of the plurality of color filters is configured to transmit
light in at least one wavelength spectrum of light of
a red wavelength spectrum of light,
a green wavelength spectrum of light, and
a blue wavelength spectrum of light, and
light in the infrared wavelength spectrum of light.

9. The image sensor of claim 1, wherein each color filter of the plurality of color filters is selected from a red filter, a blue filter, a green filter, a cyan filter, a magenta filter, a yellow filter, and a white filter.

10. The image sensor of claim 1, wherein the photodiode is at least partially within the semiconductor substrate at a depth of about 0 nm to about 7000 nm from a surface of the semiconductor substrate.

11. The image sensor of claim 1, wherein
the visible light blocking film includes a black matrix.

12. The image sensor of claim 1, further comprising:
a bandpass filter on the plurality of color filters and configured to selectively transmit light in the visible wavelength spectrum of light and light in the infrared wavelength spectrum of light.

13. An image sensor, comprising:
a color filter, an organic photoelectric conversion device, a transparent insulation layer, a visible light blocking film, and an inorganic photodiode that are sequentially stacked from a light incidence direction,
wherein the organic photoelectric conversion device is configured to photoelectrically convert light in a visible wavelength spectrum of light that passes the color filter,
wherein the inorganic photodiode is configured to sense infrared light, the infrared light being light in an infrared wavelength spectrum of light, and
wherein the visible light blocking film is configured to absorb and/or reflect visible light, and the visible light blocking film overlaps at least an entirety of the inorganic photodiode, such that the visible light blocking film is configured to selectively transmit the infrared light to the inorganic photodiode,
wherein the color filter and the organic photoelectric conversion device are on a semiconductor substrate,
wherein the inorganic photodiode is within the semiconductor substrate,
wherein the inorganic photodiode is at least partially within the semiconductor substrate at a depth of about 0 nm to about 7000 nm from a surface of the semiconductor substrate,
wherein the color filter has an average light transmittance of greater than or equal to about 70% in an infrared wavelength spectrum of light of about 800 nm to about 1000 nm.

14. The image sensor of claim 13, wherein the organic photoelectric conversion device includes
a pair of electrodes facing each other, and
an organic photoelectric conversion layer between the pair of electrodes and configured to selectively absorb light in the visible wavelength spectrum of light.

15. The image sensor of claim 14, wherein the organic photoelectric conversion layer includes
an organic light absorbing material, and
fullerene or a fullerene derivative.

16. The image sensor of claim 14, wherein the organic photoelectric conversion layer is configured to absorb light in an entirety of the visible wavelength spectrum of light.

17. The image sensor of claim 13, wherein the color filter includes at least one filter of a red filter, a blue filter, a green filter, a cyan filter, a magenta filter, a yellow filter, and a white filter.

18. An electronic device comprising the image sensor of claim 13.

19. An electronic device comprising the image sensor of claim 1.

20. The image sensor of claim 1, wherein the plurality of color filters includes at least one filter of a cyan filter, a magenta filter, a yellow filter, and a white filter.

21. The image sensor of claim 13, wherein the color filter includes at least one filter of a cyan filter, a magenta filter, a yellow filter, and a white filter.

* * * * *